United States Patent [19]

Feichtner et al.

[11] Patent Number: 4,668,538
[45] Date of Patent: May 26, 1987

[54] PROCESSES FOR DEPOSITING METAL COMPOUND COATINGS

[75] Inventors: John D. Feichtner, Murrysville; James T. Veligdan, Penn Hills Township, Allegheny County, both of Pa.

[73] Assignee: Westinghouse Electric Corp., Pittsburgh, Pa.

[21] Appl. No.: 629,534

[22] Filed: Jul. 10, 1984

[51] Int. Cl.$^4$ .................... C23C 16/30; C23C 16/32
[52] U.S. Cl. ................... 427/248.1; 427/249; 427/255
[58] Field of Search ...... 427/248.1, 249, 255, 427/314, 318, 42

[56] References Cited

U.S. PATENT DOCUMENTS 2,884,894  5/1959  Ruppert et al. ............... 427/255
4,268,582  5/1981  Hale et al. .
4,374,162  2/1983  Takagi ....................... 427/248.1

FOREIGN PATENT DOCUMENTS 38-26262   5/1961  Japan ........................ 427/248.1
49-33756   9/1974  Japan ........................ 427/248.1
52-83173  11/1977  Japan ........................ 427/248.1

OTHER PUBLICATIONS

Shinoda et al, "CVD Al$_2$O$_3$ Films on III-V Binary Semiconductors", Japanese Journal of Applied Physics, vol. 19, No. 6, pp. L299-L301, Jun. 1980.
Powell et al., "Vapor Deposition", pp. 343-352, 384-386 & 398-402, TS695, P6, May, 1972.
Guy, "Elements of Physical Metallurgy", Addison-Wesley Publishing Co., (1967), pp. 142-146.
Schwarzkopf et al., "Refractory Hard Metals", MacMillan Co., (1953), pp. 172-180, 260-268, 312-315.
"American Society for Metals," Metals Handbook, Ninth Edition, vol. 5, pp. 361-374, 381-421 (10/82).
J. T. A. Roberts, "Structural Materials in Nuclear Power Systems," (1981), pp. 53-60, 119-124.

Primary Examiner—Sadie L. Childs
Attorney, Agent, or Firm—John J. Prizzi

[57] ABSTRACT

A metal compound having a metal radical containing one or more metals, and a radical containing hydrogen and one or more of the elements C, N, O and B is thermally decomposed in the presence of a substrate to form a coating of a metal oxide, nitride carbide or boride on the substrate. In one embodiment of the invention, the metal compound is entrained in a supersonic molecular beam which, upon impact with the surface to be coated, thermally decomposes, forming a refractory metal coating and gaseous by-products.

4 Claims, 2 Drawing Figures

PROCESSES FOR DEPOSITING METAL COMPOUND COATINGS

BACKGROUND OF THE INVENTION

The present invention pertains to processes for coating substrates with a metal compound. It is especially concerned with processes for depositing a thin metal compound coating containing a nuclear poison material on a fissile or fertile substrate.

Coatings of refractory metal compounds have been deposited on a variety of substrates by a variety of techniques. Some of the more commercially important coating technologies include Thermal Spray Coating, Chemical Vapor Deposition (CVD), Vacuum Coating, Sputtering, and Ion Plating. These technologies are summarized in the American Society for Metals, "Metals Handbook Ninth Edition: Volume 5 Surface Cleaning, Finishing and Coating," (published October, 1982) at pages 361–374 and 381–421. The aforementioned pages 361–374, 381 to 421 are hereby incorporated by reference.

Examples of CVD processes for coating a cemented carbide substrate with a refractory metal boride layer are described in U.S. Pat. No. 4,268,582. The specification of U.S. Pat. No. 4,268,582 is hereby incorporated by reference.

Thermal neutron fission reactors presently incorporate so-called "burnable poisons in the fuel or internal reactor structures. A "burnable poison" is an element which has a high thermal neutron absorption cross section, and which undergoes upon neutron absorption a nuclear reaction which transmutes the element to an isotopic species of much lower neutron absorption cross section. An example is the element Boron, which consists of two naturally occurring isotopes, $_5{}^{10}B$ and $_5{}^{11}B$. $_5{}^{10}B$ has a very high (3,838 barns) cross section for the reaction

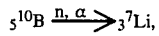

$$_5{}^{10}B \xrightarrow{n,\alpha} {}_3{}^7Li,$$

whereas the product, $_3{}^7Li$, has a very low neutron absorption cross section. During the operation of a thermal reactor, nuclei of the fissile fuel material (e.g. $^{235}U$) undergo fission under neutron bombardment. This process burns up fuel and also generates fission products which contribute residual neutron absorption cross sections which eventually act as a stable poison, reducing the reactor multiplication factor. Thus, in order to provide for long periods of reactor operation between fuel reloadings, it is desirable to incorporate at the start of each operational period, a fuel loading considerably in excess of that needed merely to bring the reactor to criticality and operate at the desired power levels. In order to help control the reactivity provided by the excess fuel and reduce the volume of control rods needed, a "burnable poison" such as the boron discussed above is incorporated. As the reactor operates, fuel is burned and reaction products build up. The resultant decrease in reactivity is offset by the disappearance of the burnable poison.

Some of the methods of incorporating burnable poisons, such as boron and gadolinium, into water reactor systems are described in J. T. A. Roberts, "Structural Materials in Nuclear Power Systems" (published 1981), at pages 53–60, and pages 119–124. Roberts, pages 53–60 and 119–124 are hereby incorporated by reference. Other methods of incorporating a burnable poison into the reactor system include coating the fuel pellets with the burnable poison in elemental or compound form.

Chemical vapor deposition techniques for coating fuel pellets with a burnable poison compound are disclosed in U.S. patent application Ser. Nos. 564,057 now U.S. Pat. No. 4,560,575 468,743 now U.S. Pat. No. 4,582,676; and 468,788 now U.S. Pat. No. 4,587,087, filed on Dec. 21, 1983, Feb. 22, 1983, and Feb. 22, 1983, respectively. Sputtering techniques for depositing burnable poison compounds coatings on fuel pellets are described in U.S. patent application Ser. No. 526,712, now U.S. Pat. No. 4,587,088, filed on Aug. 26, 1983. The foregoing patent applications are hereby incorporated by reference.

The present inventors have now surprisingly discovered a new process for applying a refractory metal compound coating to a substrate surface. The process according to the present invention requires that a metal compound be thermally decomposed in the vicinity of the substrate surface to be coated. Included in the products of thermal decomposition is the desired refractory metal compound which is deposited on the surface. Essentially, all other products of the thermal decomposition are volatilized.

The metal compound starting material contains a radical having one or more metals, and a second radical containing hydrogen and one or more of the elements oxygen, nitrogen, carbon and boron.

According to one embodiment of the present invention, the substrate surface to be coated has been preheated to a temperature above the thermal decomposition temperature of the metal compound. Preferably the temperature of the substrate is below about 400° C.

According to another embodiment of the present a molecular beam containing the metal compound is impinged upon the surface to be coated. Upon impact the organometallic composition thermally decomposes. In this embodiment, while this substrate surface may be preheated, it is not required.

The aforementioned and other aspects of the present invention will become more apparent upon examination of the drawings, which are briefly described below, in conjunction with the detailed description of the invention.

DETAILED DESCRIPTION OF THE INVENTION

Figure 1:
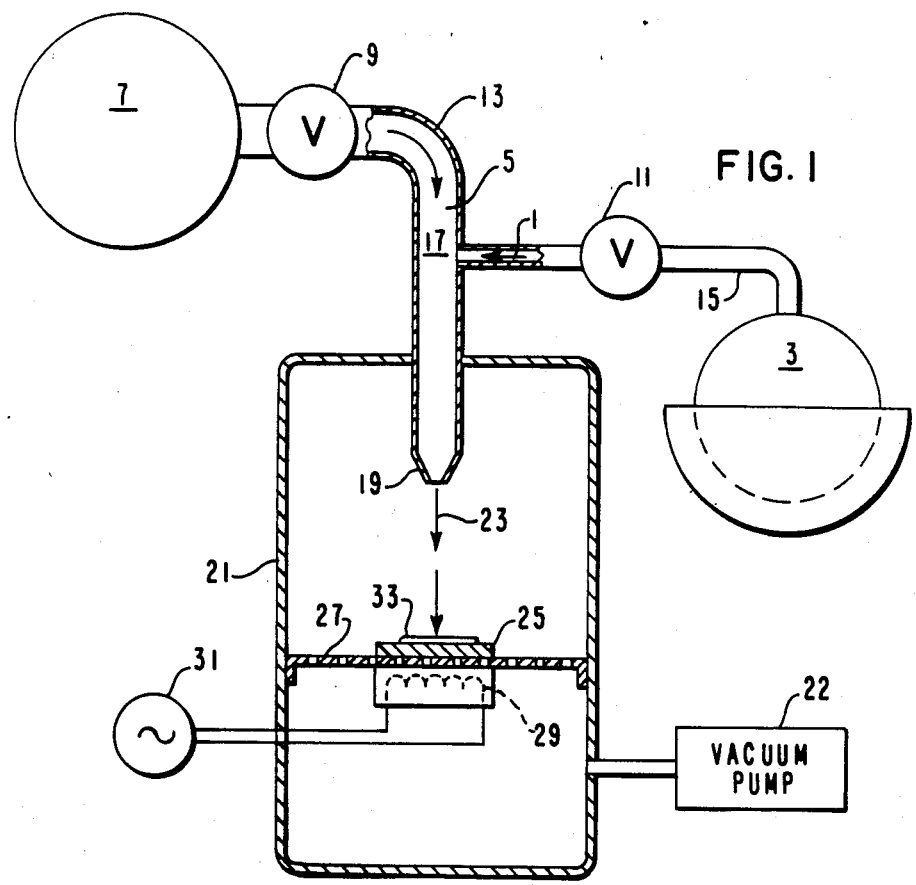
FIG. 1 shows a schematic representation of an apparatus useful in performing one of the coating processes in accordance with the present invention.

In accordance with the present invention a coating of a refractory metal compound is provided to a substrate surface by thermally decomposing, a metal compound in the vicinity of the surface. The metal compounds suitable for use in our process are those having a metal radical containing one or more metals, and a second radical containing hydrogen and one or more of the elements carbon, nitrogen, oxygen and boron. These starting materials must also be able to be vaporized below their thermal decomposition temperature, and then when raised above their thermal decomposition temperature decompose to the desired refractory metal compound with the remaining elements forming gaseous byproducts. Preferably, complete thermal decomposition occurs below about 400° C.

For example, preferred starting materials for making metal borides and metal oxides, include metal compounds having the following formulas:

For example, for starting materials of the type $M(BH_4)_4$, M may be selected from the reactive metals group comprising Ti, Zr and Hf. For example, for starting materials of the tertiary-amyloxide type (i.e., $M(OC_5H_{11})_4{}^t$) and the tertiary butoxide type (i.e., $M(OC_4H_9)_4{}^t$), M may also be selected from the reactive metals group of Ti, Zr and Hf. For example, starting materials of the tertiary-isopropoxide type (i.e., $M(OC_3H_7)_4{}^t$), M may be selected from the group comprising Al, Y, Ti, Zr, Hf and Th. It should also be noted that for the tertiary isopropoxide starting materials, boron may be substituted for the listed metals. More particularly, $Zr(BH_4)_4$ is specifically contemplated for use in making $ZrB_2$ coatings.

The substrates that may be coated by the present invention include metals, alloys, cemented carbides, glasses, and pre-existing metal oxides, nitrides, borides, and carbides. In a preferred embodiment of the present invention this substrate is a pressed and sintered oxide fuel pellet containing a fertile or fissile fuel material, such as $U^{235}$, in the form of $UO_2$. The coating according to the present invention, preferably $ZrB_2$, would be applied to the circumferential surface of a conventional, generally cylindrical pellet. The pellet may in addition have a preexisting coating, of niobium, and then optionally, have a second coating of niobium or other metal applied after the $ZrB_2$ is applied in accordance with the present invention. These metallic coatings may be applied by sputtering or CVD as described in copending application Ser. Nos. 526,712; 468,743; and 468,788.

The coatings that may be produced by the present invention include refractory metal compounds such as the metal oxides, metal nitrides, metal carbides, metal borides, their solid solutions, as well as their mixtures.

In accordance with our process the gaseous starting metal compound is brought into the vicinity of the substrate surface, where it is heated above its decomposition temperature and it thus decomposes into the desired refractory metal compound which deposits on the substrate surface, and gaseous by products which are removed from the vicinity of the substrate surface. The substrate itself may be heated above the decomposition temperature by radiant heating or other heat source.

In the preferred embodiment of our coating process the gaseous starting metal compound has been entrained in a carrier gas which is chemically inert with respect to the starting metal compound, the substrate surface to be coated and the refractory metal compound to be deposited on the surface. This mixture is then formed into a high velocity about $10^4$ to $10^6$ cm/sec, and preferably supersonic, molecular beam which is directed at the surface to be coated. As the gas molecules in the beam impact the substrate surface, instantaneous heat is created causing the previously described thermal decomposition reaction to occur. Optionally, this substrate surface may also have been preheated to a temperature above the thermal decomposition temperature. Most preferably, this coating process according to the present invention is performed under a partial vacuum.

The invention will be further clarified by a consideration of the following example, which is intended to be purely exemplary of the invention.

Using equipment similar to that schematically shown in the figure we have found that thin layers of $ZrB_2$ can be deposited on substrate surfaces using vapor phase zirconium borohydride ($Zr(BH_4)_4$) as the metal compound starting material. As shown in the figure a stream of $Zr(BH_4)_4$ vapors 1, which were produced in the temperature controlled containment vessel 3, were allowed to enter a stream of helium carrier gas 5 coming from helium reservoir 7. Valves 9 and 11 were utilized to control the pressures of the helium and $Zr(BH_4)$, respectively within conduits 13 and 15. The $Zr(BH_4)$ vapor pressure ranged from 1.8 to about 15 torr and was mixed with the helium carrier gas in the region 17 upstream of nozzle 19. The pressure of helium in this region ranged from 10 to 1000 torr. This gaseous mixture then expanded from the nozzle 17 into the partial vacuum (about $10^{-6}$ torr) within the coating chamber 21, the partial vacuum being maintained by vacuum pumps 22. In so expanding the gaseous mixture formed a molecular beam 23. The temperature of the nozzle 19 was typically between about 55° and 75° C. Our measurements indicated that the mean velocity of the $Zr(BH_4)_4$ molecules in the beam was typically about $8 \times 10^4$ cm/sec, indicating that the mean kinetic energy, eV, of a $Zr(BH_4)_4$ molecule was about 0.5 eV (electron volts). After traveling about 10 centimeters from the nozzle exit the molecules struck a heated stainless steel surface 25 held within the path of the beam by support means 27. The stainless steel surface 25 had been preheated to about 150° to 300° C. by radiant heat received from hot filaments 29 electrically connected to a variable power supply source 31.

Upon impact with surface 25, the $Zr(BH_4)_4$ molecules thermally decomposed leaving a deposit 33 of $ZrB_2$ on surface 25. X-ray diffraction analysis of the deposit using the Debye-Scherrer technique positively identified the deposit as $ZrB_2$ (ASTM #60610) with the possibility of some $ZrB_{12}$ (ASTM #60590).

It is our belief that the thermal decomposition of the $Zr(BH_4)_4$ results from the elevated temperature of the surface 25 and/or the thermal energy deposited at the impact point of the energetic (0.5 eV) $Zr(BH_4)_4$ molecule. It is known that $(Zr(BH_4)_4$ molecules begin to thermally decompose at temperatures above 200° C. We believe that the thermal decomposition proceeds as follows:

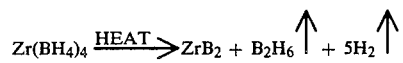

In the equipment used, the $B_2H_6$ and $H_2$ gaseous by-products were quickly evacuated from the vicinity of surface 25 leaving the $ZrB_2$ film 33.

Figure 2:
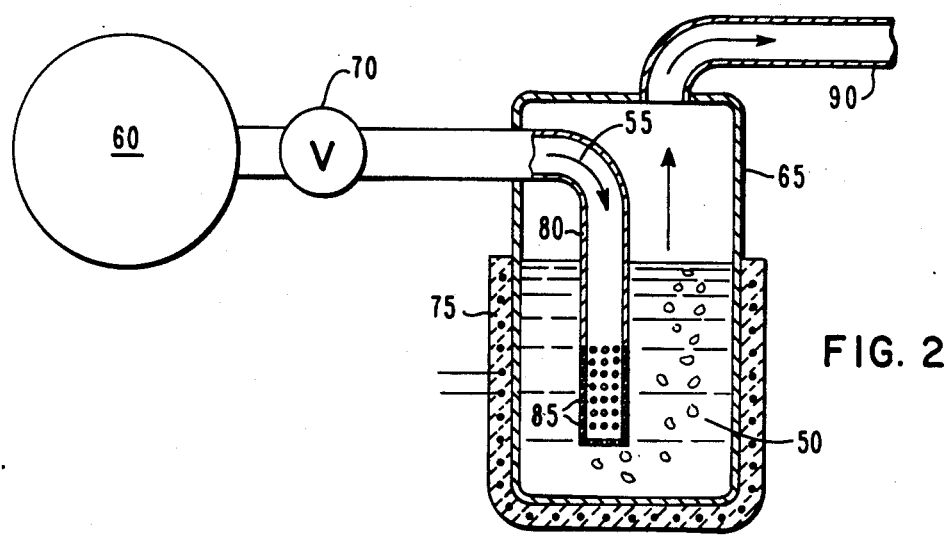
FIG. 2 illustrates an alternative method of entraining the metal compound starting material into the carrier gas stream.

Shown in FIG. 2 is an alternative method of entraining the starting material compound 50 into the carrier gas stream 55. The carrier gas stream 55 from carrier gas reservoir 60 is directed into chamber 65 containing the starting material compound 50, preferably as a powder, or as a liquid. The flow rate of the carrier gas stream 55 is controlled by valve 70. The temperature of the starting material 50 in chamber 65 is controlled by the temperature control element 75 adjacent to the chamber.

The carrier gas stream 55 exits conduit 80 through an opening or openings 85 buried in the starting material 50. The carrier gas then percolates or bubbles through the starting material compound 50 and as it does so, vapors of the starting material compound are entrained in the carrier gas. The gas mixture formed exits the chamber through conduit 90 which directs the mixture to the nozzle 19 in the coating chamber 21 as shown in FIG. 1. The gas mixture velocity and composition may be controlled by valve 70 and the vaporization rate of the starting material 50 which is temperature dependent, and regulated by temperature control element 75.

Other embodiments of the invention will become more apparent to those skilled in the art from a consideration of the specification or practice of the invention disclosed herein. It is intended that the specification and examples be considered as exemplary only, with the true scope and spirit of the invention being indicated by the following claims.

We claim:

1. A process for coating a substrate, wherein said process comprises the steps of:

thermally decomposing a gaseous metal compound in the vicinity of the surface of said substrate thereby depositing a refractory metal compound on said surface, while volatizing at least essentially all other products of said thermal decomposing of said metal compound;

said thermal decomposing of said metal compound occurs by forming said gaseous metal compound into a molecular beam wherein said gaseous metal compound has a velocity of about $10^4$ cm/sec to about $10^6$ cm/sec, and impinging said beam on said surface wherein said thermal decomposing of said metal compound occurs as the gaseous metal compound molecules in said beam impact said surface causing the production of thermal energy in a quantity sufficient to raise the temperature of said gaseous metal compound molecules of above the thermal decomposition temperature of said metal compound, wherein said gaseous metal compound comprises a metal radical containing one or more metals and a radical containing hydrogen and one or more of the elements selected from the group consisting of C, N, O and B; and wherein said refractory metal compound is selected from the group consisting of metal oxides, metal nitrides, metal carbides, metal borides, their solid solution and mixtures with each other.

2. A process for coating a substrate, comprising the steps of:

impacting the surface of said substrate with a gaseous stream containing metal compound molecules having a molecular kinetic energy, $E_k$;

wherein upon impact with said surface, said molecular kinetic energy, $E_k$, is at least partially converted to heat raising the temperature of said molecules above the temperature required for complete thermal decomposition of said molecules; and said molecules thermally decomposing to a solid refractory metal compound adhering to said surface and a gaseous by-product.

3. The process according to claim 1 wherein said metal compound is $Zr(BH_4)_4$ and said refractory metal compound is $ZrB_2$.

4. The process according to claim 2 wherein said metal compound is $Zr(BH_4)_4$ and said refractory metal compound is $ZrB_2$.

* * * * *